United States Patent
Ray

(10) Patent No.: US 6,893,796 B2
(45) Date of Patent: May 17, 2005

(54) FLEXOGRAPHIC ELEMENT HAVING AN INTEGRAL THERMALLY BLEACHABLE MASK LAYER

(75) Inventor: Kevin B. Ray, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 257 days.

(21) Appl. No.: 10/223,937

(22) Filed: Aug. 20, 2002

(65) Prior Publication Data

US 2004/0038147 A1 Feb. 26, 2004

(51) Int. Cl.$^7$ ................................................ G03F 7/11
(52) U.S. Cl. ........................... 430/273.1; 430/281.1; 430/306; 430/348; 430/434; 430/494; 430/512
(58) Field of Search ........................ 430/273.1, 281.1, 430/286.1, 302, 306, 309, 348, 434, 494, 511, 512

(56) References Cited

U.S. PATENT DOCUMENTS

| | | | |
|---|---|---|---|
| 3,769,019 A | 10/1973 | Wiese, Jr. et al. | 96/84 |
| 4,081,278 A | 3/1978 | Dedinas et al. | 96/48 |
| 4,863,819 A | 9/1989 | Drexler et al. | 430/14 |
| 5,262,275 A | 11/1993 | Fan | 430/273 |
| 5,399,459 A | 3/1995 | Simpson et al. | 430/270 |
| 5,506,086 A | 4/1996 | Van Zoeren | 430/201 |
| 5,705,310 A | 1/1998 | Van Zoeren | 430/201 |
| 5,759,742 A | 6/1998 | West et al. | 430/278.1 |
| 5,773,170 A * | 6/1998 | Patel et al. | 430/5 |
| 5,925,500 A | 7/1999 | Yang et al. | 430/300 |
| 5,994,026 A | 11/1999 | DeBoer et al. | 430/270.1 |
| 6,080,523 A * | 6/2000 | Vermeersch et al. | 430/270.1 |
| 6,238,837 B1 | 5/2001 | Fan | 430/273.1 |
| 6,383,692 B1 | 5/2002 | Leenders et al. | |
| 6,410,208 B1 * | 6/2002 | Teng | 430/302 |

FOREIGN PATENT DOCUMENTS

WO        01/09679        2/2001

* cited by examiner

Primary Examiner—Mark F. Huff
Assistant Examiner—Barbara Gilliam
(74) Attorney, Agent, or Firm—RatnerPrestia

(57) ABSTRACT

An imageable element useful as a flexographic printing plate precursor is disclosed. The element is made up of a flexible substrate; a photosensitive layer, which contains a negative working photosensitive composition; an optional barrier layer; and a masking layer. The masking layer is thermally bleachable, comprises a dye that typically has an absorption maximum between about 250 nm and about 600 nm, more typically between about 300 nm and about 500 nm, and is substantially free of photothermal conversion materials.

22 Claims, No Drawings

FLEXOGRAPHIC ELEMENT HAVING AN INTEGRAL THERMALLY BLEACHABLE MASK LAYER

FIELD OF THE INVENTION

The invention relates to imageable elements useful in flexographic printing. More particularly, this invention relates to imageable elements that comprise a thermally bleachable masking layer, which are useful as flexographic printing plate precursors.

BACKGROUND OF THE INVENTION

Flexographic printing plates are used in letterpress printing, particularly on surfaces which are soft and easily deformable, such as packaging materials, e.g., cardboard, paper, and plastic packaging films. Flexographic printing plates can be prepared from imageable elements that comprise a photosensitive layer on a support. The element is imaged with ultraviolet and/or visible radiation and then developed with a suitable developer leaving a printing relief, which can be used for flexographic printing. If after exposure to radiation the exposed regions of the photosensitive layer are removed in the developing process, the element is positive working. Conversely, if the developing process removes the unexposed regions and the exposed regions remain, the element is negative working. Elements useful as flexographic printing plate precursors are typically negative working.

Imaging of the imageable element with ultraviolet and/or visible radiation is typically carried out through a mask, which has clear and opaque regions. Imaging takes place in the regions of the photosensitive layer under the clear regions of the mask but does not occur in the regions of the photosensitive layer under in the opaque regions of the mask. For negative working systems, the mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of printing plate precursors, which obviates the need for exposure through a mask, is becoming increasingly important in the printing industry. In these processes, a computer controlled laser scans and images the photosensitive layer of the printing plate precursor. However, it has not been practical to use lasers to image flexographic printing plate precursors, which have relatively thick photosensitive layers. These elements have low photosensitivity and require long exposure times even with high-powered lasers. In addition, most of the imageable materials used in these elements have their greatest sensitivity in the ultraviolet region of the spectrum. Although ultraviolet emitting lasers are known, economical and reliable ultraviolet lasers with high power are not readily available. However, relatively inexpensive infrared lasers that have a useful power output are readily available. These lasers have been used to form an integral mask over the photosensitive layer.

Flexographic printing plate precursor that comprises a masking layer that is ablatable by infrared radiation over the photosensitive layer have been used to avoid these problems and yet retain the advantages of direct digital imaging. The masking layer is imaged with an infrared laser and the resulting element exposed with ultraviolet and/or visible radiation through the mask. However, because ablation produces debris, the filmsetter used to image ablative masks requires additional filtration systems to prevent the debris from contaminating the optics of the filmsetter. In addition, some of the of the ablatable layers require large amounts of expensive infrared absorbers.

Thus, a need exists for imageable elements useful as flexographic printing plate precursors that have the advantages of direct digital imaging but do not have the disadvantages of laser exposure.

SUMMARY OF THE INVENTION

In one aspect, the invention is an imageable element useful as flexographic printing plate precursor, the element comprising:

(a) a flexible substrate, (b) a photosensitive layer, the photosensitive layer comprising a negative working photosensitive composition, and (c) a masking layer, the masking layer comprising a binder and a thermally bleachable system;

in which:

the thermally bleachable system comprises a dye that has an absorption maximum between about 250 nm and about 600 nm, and the masking layer is substantially free of photothermal conversion materials.

In one aspect, the element additionally comprises a barrier layer between the photosensitive layer and the masking layer.

In another aspect, the invention is a process for making an image useful as a flexographic printing plate, the process comprising:

imaging the imageable element with a heated body and forming a mask;

overall exposing the imageable element through the mask and forming an imaged imageable element comprising imaged and complementary unimaged regions in the photosensitive layer; and developing the imaged imageable element in a developer and forming the image by removing the unimaged regions.

DETAILED DESCRIPTION OF THE INVENTION

Unless the context indicates otherwise, in the specification and claims, the terms binder, dye, thermally bleachable dye, thermally bleachable system, photothermal conversion material, monomer, photoinitiator, and similar terms also include mixtures of such materials. Unless otherwise specified, all percentages are percentages by weight.

Imageable Elements

The imageable element comprises, in order, a substrate, a photosensitive layer, optionally a barrier layer, and a masking layer. The photosensitive layer comprises a negative working photosensitive composition. The masking layer comprises a binder and a thermally bleachable system and is substantially free of photothermal conversion materials. The thermally bleachable system comprises a dye that is bleached during thermal exposure.

Substrate

The substrate comprises a flexible support, which may be any flexible material conventionally used to prepare imageable elements useful as printing plates. The support is preferably strong and stable. It should resist dimensional change under conditions of use so that color records will register in a full-color image. Because imaging with heated body, such as a thermal head, requires good contact with the masking layer for imaging, the support material must be flexible for good contact during imaging. When the imageable element requires a backflash exposure, the support must be transparent to the radiation used for the backflash exposure.

Suitable support materials include polymeric films such as polyester, polystyrene, polyethylene, polypropylene, polycarbonate, polyamide and fluoropolymers. A preferred support is a polyester film; particularly preferred is polyethylene terephthalate. The support is typically about 0.0051 to 0.025 cm thick, preferably about 0.0076 to 0.020 cm thick.

The substrate may also comprise a subbing layer over the surface of the support adjacent to the photosensitive layer and an antihalation layers layer on either or both surfaces of the support.

Photosensitive Layer

The photosensitive layer comprises a layer of a photosensitive composition over the support. Any photosensitive composition used in the photosensitive layer of flexographic printing plate precursors may be used in the photosensitive layer. Negative-working, ultraviolet and/or visible sensitive, photopolymerizable photosensitive compositions useful in the photosensitive layer of flexographic printing plate precursors, are well known. These compositions comprise an elastomeric binder, at least one free-radical polymerizable monomer, and a photoinitiator that is sensitive ultraviolet and/or visible radiation. Examples of suitable compositions have been disclosed, for example, in Chen, U.S. Pat. No. 4,323,637; Gruetzmacher, U.S. Pat. No. 4,427,759; and Feinberg, U.S. Pat. No. 4,894,315.

The elastomeric binder can be a single polymer or mixture of polymers that are soluble, swellable or dispersible in aqueous, semi-aqueous or organic solvent developers. Binders that are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue, U.S. Pat. No. 3,794,494; Proskow, U.S. Pat. No. 4,177,074; Proskow, U.S. Pat. No. 4,431,723; and Worns, U.S. Pat. No. 4,517,279. Elastomeric binders that are soluble, swellable or dispersible in organic solvent developers include natural or synthetic polymers of conjugated diolefin hydrocarbons, including polyisoprene, poly(1,2-butadiene), poly(1,4-butadiene), butadiene/acrylonitrile, polystyrene-polybutadiene-polystyrene thermoplastic-elastomeric block copolymers, polystyrene-polyisoprene-polystyrene thermoplastic-elastomeric block copolymers, and other copolymers. The block copolymers discussed in Chen, U.S. Pat. No. 4,323,636; Heinz, U.S. Pat. No. 4,430,417; and Toda, U.S. Pat. No. 4,045,231 can be used. The binder preferably comprises at least 65% by weight of the photosensitive composition. Core shell microgels and blends of microgels and preformed macromolecular polymers, such as those disclosed in Fryd, U.S. Pat. No. 4,956,252, may also be used.

The photosensitive composition comprises a free-radical polymerizable monomer or mixture of free-radical polymerizable monomers. The monomer or monomers must be compatible with the binder and the other ingredients to the extent that a clear, non-cloudy photosensitive layer is produced. Monomers are well known in the art and include, for example, addition-polymerization ethylenically unsaturated compounds having relatively low molecular weights (generally less than about 30,000). Preferably, the monomers have a relatively low molecular weight, less than about 5000.

Numerous unsaturated monomers, oligomers, and prepolymers polymerizable by free-radical initiated addition polymerization and useful in photosensitive compositions are known in the art. Typical multifunctional monomers are unsaturated esters of alcohols, preferably acrylate and methacrylate esters of polyols, such as, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate; glycerol triacrylate and trimethacrylate; ethylene glycol dimethacrylate; pentaerythritol tri- and tetra-acrylate and methacrylate; dipentaerythrol penta- and hexa-acrylate and methacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; and neopentyl glycol diacrylate and dimethacrylate. Monofunctional monomers, which are sometimes used in combination with multifunctional monomers include, for example, t-butyl acrylate and methacrylate, N,N-diethylaminoethyl acrylate, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, isobornyl acrylate and methacrylate, phenyl acrylate and methacrylate, 2-phenylethyl acrylate and methacrylate, and tetrahydrofurfuryl acrylate and methacrylate. Further examples of monomers useful in the photosensitive layer of flexographic printing plate precursors can be found in Chen, U.S. Pat. No. 4,323,636; Fryd, U.S. Pat. No. 4,753,865; Fryd, U.S. Pat. No. 4,726,877; and Feinberg, U.S. Pat. No. 4,894,315. Preferably the monomer comprises at least 5% by weight of the photosensitive composition.

The photoinitiator can be any single compound or combination of compounds that generate free radicals that initiate the polymerization of the monomer or monomers without excessive termination. The photoinitiator is sensitive to visible or ultraviolet radiation, preferably ultraviolet radiation, and should be insensitive to infrared radiation and preferably is thermally inactive at and below 185° C. Photoinitiators are disclosed in "Photoinitiators for Free-Radical-initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Suitable photoinitiators have been disclosed in Gruetzmacher, U.S. Pat. No. 4,460,675, and Feinberg, U.S. Pat. No. 4,894,315. Examples of photoinitiators include substituted and unsubstituted polynuclear quinones, benzophenone; benzophenone and 4,4'-bis(dimethylamino)benzophenone; benzophenone and 4,4'-bis(diethylamino)benzophenone; 2-hydroxy-2-methyl-1-phenylpropan-1-one; 2,4,6-trimethylbenzolyl-diphenylphosphine oxide; 2,2-dimethoxy-2-phenyl-acetophenone (benzildimethyl ketal, BDK); 2-methyl-1-[4-

(methylthio)phenyl]-2-morpholinopropanone-1; 1-hydroxycyclohexylphenyl ketone (HCPK); bis(2,6-dimethoxybenzolyl)-2,4,4-trimethyl-pentylphosphine oxide; and combinations thereof. The photoinitiators typically comprise about 0.001 wt % to 10.0 wt % of the weight of the photosensitive composition.

The photosensitive composition may comprise other additives depending on the final properties desired. Such additives include plasticizers, rheology modifiers, thermal polymerization inhibitors, tackifiers, colorants, surfactants, antioxidants, antiozonants, or fillers. Plasticizers are used to adjust the film-forming properties of the elastomer. Plasticizers are well known in the art and include, for example, aliphatic hydrocarbon oils, e.g., naphthenic and paraffinic oils; and liquid polydienes, e.g., liquid polybutadiene and liquid polyisoprene. Resistance of the elements and the flexographic printing plates prepared therefrom to oxygen and ozone attack can be improved by incorporating in the photosensitive composition a suitable amount of compatible antioxidants and/or antiozonants. Antioxidants include, for example, alkylated phenols, e.g., 2,6-di-tert-butyl4-methyl phenol; alkylated bis-phenols, e.g., 2,2-methylene-bis-(4-methyl-6-tert-butyl phenyl); 1,3,5-trimethyl-2,4,6-tris(3,5-di-tert-butyl4-hydroxybenzyl) benzene; 2-(4-hydroxy-3,5-tert-butyl anilino)4,6-bis-(n-octylithio)1,3,5-triazone; polymerized trimethyl dihydroquinone; zinc dibutyl dithiocarbamate and dilaurylthiodipropionate. Antiozonants include, for example, micro crystalline wax and paraffin wax; dibutyl thiourea; 1,1,3,3-tetramethyl-2-thiourea; norbornenes such as di-5-norbomene-2-methyl adipate; and unsaturated vegetable oils. The composition may also comprise one or more dyes for identification or aesthetic purposes, provided they are compatible with the other ingredients, do not strongly absorb the radiation used for photopolymerization, and do not otherwise interfere with photopolymerization.

The mixture of monomer, binder, photoinitiator, and, if any, other ingredients should produce a clear, non-cloudy photosensitive layer, without causing appreciable scattering of the radiation used for overall exposure. The thickness of the photosensitive layer can vary over a wide range depending upon the type of printing plate desired. Thick, soft reliefs are useful for flexographic printing. For so-called "thin plates" the photosensitive layer is about 0.05 to 0.17 cm thick. Thicker plates have a photosensitive layer about 0.25 to 0.64 cm thick, or greater.

Barrier Layer

An essentially oxygen-impermeable barrier layer, which is soluble in the developer and transparent to to the radiation used for the overall exposure, may be applied over the photosensitive layer. The barrier layer inhibits the migration of oxygen into the photosensitive layer and can also inhibit the migration of materials from the photosensitive layer into the masking layer.

Preferred binders for the barrier layer are water-soluble polymers such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, gelatine, cellulose ethers, and mixtures thereof. Most preferred is polyvinyl alcohol.

The barrier layer may also contain other ingredients, such as surfactants. To improve the adhesion of the overcoat layer to the photosensitive layer, an adhesion promoter can be added to the overcoat layer formulation. One example for such an adhesion promoter is poly(vinyl imidazole) as disclosed in WO 99/06890. The coating weight of the barrier layer typically is about 0.1 to 6 $g/m^2$, and more typically about 0.5 to 4 $g/m^2$.

Masking Layer

The element comprises a masking layer that comprises one or more polymeric binders, and dispersed therein, one or more thermally bleachable systems. The thermally bleachable system comprises a dye that absorbs in the region of the spectrum used for overall exposure. The masking layer may also comprise other ingredients that react with the dye during thermal exposure. Other ingredients, such as surfactants, may also be present. The masking layer does not comprise a photothermal conversion material.

Useful polymeric binders include, for example, cellulose resins such as hydroxypropylcellulose, cellulose acetate hydrogen phthalate, cellulose acetate, cellulose acetate propionate, cellulose acetate butyrate, cellulose triacetate, and cellulose nitrate; polycarbonates; polyurethanes; polyesters; poly(vinyl acetate); polystyrene and polystyrene derivatives; vinylpyrrolidone polymers; polyethyloxazoline; and mixtures thereof. The cellulose resins are preferred.

The masking layer comprises a thermally bleachable system. "Thermally bleachable systems" are systems whose absorption at the wavelength or wavelengths used for the overall exposure decrease on thermal exposure. Included are "thermally bleachable dyes," that is, dyes whose absorption at the wavelength or wavelengths used for the overall exposure decrease on thermal exposure. Typically the dyes undergo a thermally initiated reaction to produce products that are substantially non-absorbing in the region or regions of the spectrum used for the overall exposure. Also included are systems that comprise a dye and a component that undergoes a thermally initiated reaction to form intermediates that react with the dye such that the absorption of the dye at the wavelength or wavelengths used for the overall exposure decreases. Thus, the thermally bleachable system comprises a dye that absorbs the radiation used for overall exposure, and is either thermally bleachable or reacts with thermally generated intermediates to reduce its absorption at the wavelengths used for overall exposure.

Any thermally bleachable system may be used in the masking layer provided: (1) it is bleachable under the thermal exposure conditions; (2) it is sufficiently soluble in a coating solvent to form a masking layer that is opaque to the radiation used for the overall exposure; and (3) it absorbs sufficiently at the wavelength or wavelengths used for overall exposure to prevent reaction in the regions of the photosensitive layer underlying the unimaged regions of the mask during overall exposure. The dye typically has an absorption maximum between about 250 nm and about 600 nm, more typically between about 300 nm and about 500 nm, the region of the spectrum to which the photosensitive layer is sensitive and which is used for the overall exposure. Developer soluble dyes are preferred. Examples of such systems are disclosed in Weise, U.S. Pat. No. 3,769,019, Dedinas, U.S. Pat. No. 4,081,278; and Simpson, U.S. Pat. No. 5,399,459.

Dedinas, U.S. Pat. No. 4,081,278, incorporated herein by reference, discloses thermally bleachable, dye-containing systems that comprise a reducible dye and a benzopinacol. Numerous dyes can be used. Useful reducible dyes include, for example, azo dyes such as, tartrazine, metanil yellow, methyl orange, ethyl red, Sudan black B, Eriochrome black T (mordant black 11), Bismark brown R, Bismark brown Y, mordant red 19, typan blue, typan red, tropaeoline O, tropaeoline OO, Congo red, Sudan III, acid blue 29, acid blue 92, acid black 24, mordant brown 1, mordant orange 10, and N,N-dimethyl-p-(4-nitrophenyazo)aniline; cyanine dyes such as cyanin; acridine dyes, such as acridine orange and acridine yellow; and triarylmethane dyes, such malachite green, brilliant green, crystal violet, gentian violet, Victoria blue B, Victoria blue R, aniline blue, methyl violet, acid violet 6B, bromoresol purple, bromcresol green, and ethyl violet. One group of preferred dyes are azo dyes, including both those having single azo groups and those having multiple azo groups, such as are disclosed in Dedinas, U.S. Pat. No. 4,081,278, column 6, line 60, to column 7, line 27, incorporated herein by reference.

Any benzopinacol can be used in the thermally bleachable system provided: it is stable to the manufacturing conditions; it dissociates when heated during the thermal bleaching reaction, typically above about 100° C.; it is soluble in a coating solvent; and it reacts with the dye to reduce the absorption of the masking layer at the wavelength or wavelengths used for overall exposure. Useful benzopinacols are disclosed in Dedinas, U.S. Pat. No. 4,081,278, column 3, line 2, to column 5, line 55, incorporated herein by reference, and include, for example, benzopinacol and decafluorobenzopinacol.

Thermally bleachable dyes are disclosed in Simpson, U.S. Pat. No. 5,399,459, incorporated herein by reference. Particularly useful thermally bleachable dyes of this type include N-alkoxycarbocyanine dyes and gluconaldehyde dianil chloride.

The amount of dye in the masking layer is generally sufficient to provide an optical density of at least 1, and preferably, an optical density of at least 2, and more preferably an optical density of at least 3, at the wavelength or wavelengths used for overall exposure. As is well known to those skilled in the art, the amount of an absorber required to produce a particular optical density can be determined from the thickness of the layer and the extinction coefficient of the absorber at the wavelength used for imaging using Beers law. The masking layer typically comprises about at least about 5 wt %, and preferably from about 10 wt % to about 50 wt % of the dye, based on the total solids in the masking layer.

The masking layer is substantially free of photothermal conversion materials. Photothermal conversion materials are infrared-absorbing materials that have a strong absorption in the region of the infrared imaging radiation, between 750 nm to 20,000 nm, typically from about 800 nm to 1200 nm. Examples are dark inorganic pigments such as carbon black, graphite, copper chromite, chromium oxides and cobalt chrome aluminate; poly(substituted-phthalocyanine compounds that absorb in this range; and dyes, for example dyes of the squarylium, merocyanine, cyanine, indolizine, pyrilium, metal diothiolene indoaniline, oxonol, anthraquinone, and merostyryl classes that absorb in this range. Photothermal conversion materials are disclosed in numerous disclosures and patents, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618, all of which are incorporated herein by reference. Photothermal conversion materials are also disclosed in Savariar-Hauck, U.S. Pat. No. 6,358,669, column 7, line 59, to column 8, line 20, incorporated herein by reference.

Coversheet

The imageable element may also comprise a temporary coversheet the masking layer. The coversheet protects the masking layer during storage and handling. Examples of suitable materials for the coversheet include thin films of polystyrene, polyethylene, polypropylene, polycarbonate, fluoropolymers, polyamide or polyester, which can be subbed with release layers.

Preparation of the Imageable Elements

The imageable elements may be prepared by applying a layer of photosensitive composition over a surface of the substrate using conventional extrusion, coating, or lamination methods. Typically the ingredients are dispersed or dissolved in a suitable coating solvent, and the resulting mixture coated by conventional methods, such as spin coating, bar coating, gravure coating, roller coating, dip coating, air knife coating, hopper coating, blade coating, slot coating, and spray coating. The term "coating solvent" includes mixtures of solvents.

A variety of conventional organic solvents, for example, alcohols such as methyl alcohol, ethyl alcohol, n- and i-propyl alcohols, n- and i-butyl alcohols and diacetone alcohol; ketones such as acetone, methyl ethyl ketone, methyl propyl ketone, diethyl ketone, and cyclohexanone; polyhydric alcohols and derivatives thereof such as ethylene glycol, ethylene glycol monomethyl ether or its acetate, ethylene glycol monoethyl ether or its acetate; ethylene glycol diethylether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as N,N-dimethylformamide, methyl lactate, and ethyl lactate, can be used as the coating solvent for the photosensitive layer. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent. Selection of the coating solvent will also depend on the nature of the ingredients present in the photosensitive composition.

Drying of the precursor is usually carried out using heated air. The air temperature is preferably between about 30° C. and about 200° C., more preferably between about 40° C. and about 120° C. The air temperature may be held constant during the drying process, or may be gradually stepped up.

Alternatively, the ingredients may be fed into an extruder and the photosensitive layer extruded onto the support. The extruder performs the function of melting, mixing, deaerating and filtering the photosensitive composition.

The barrier layer, if present, may be applied over the photosensitive layer using conventional coating or lamination techniques, such as are described above. To prevent mixing of the layers during coating, the overcoat layer is preferably coated from a solvent in which the photosensitive layer is essentially insoluble. Typical coating solvents for the overcoat layer are water and aqueous solvents that contain small amounts of organic solvents such as methanol, ethanol, or i-propyl alcohol.

The masking layer may be applied over the barrier layer, if present, or the photosensitive layer if the barrier layer is not present, using conventional coating or lamination techniques, such as are described above. The masking layer dried by heating at about 20° C. to about 150° C. for about 0.5 min to about 5 min.

The cover sheet, if present, is typically laminated over the masking layer.

Imaging and Processing

The cover sheet, if present, is removed before imaging, typically by being peeled off. The masking layer is imaged using a hot body, typically a thermal head. On imaging, the imaged regions of the masking layer undergo an irreversible reduction in optical absorption. A suitable imaging apparatus comprises at least one thermal head but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Typically, when printing using a thermal head, image signals are converted into electric pulses and are then selectively transferred to a thermal head through a driver circuit. The thermal head comprises microscopic heat resistor elements that convert the electrical energy into heat, which is transferred to the surface of the imageable element. Typically the operating temperature of the thermal head is about 300° C. to 400° C. The typical heating time per pixel may be less than 1.0 ms. Typically the pressure contact of the thermal head with the imageable element required to ensure good transfer of heat is 200 to 500 g/cm$^2$. Imaging of the masking layer produces an integral mask comprising unimaged regions, in which the absorption of the dye in the masking layer in the wavelength or wavelengths used for overall exposure has not been reduced, and imaged regions, in which absorption of the dye in the wavelength or wavelengths used for overall exposure has been reduced sufficiently to allow photopolymerization of the photosensitive layer during overall exposure.

Following imaging of the masking layer, the element is subjected to floodwise (overall or blanket) exposure with ultraviolet and/or visible radiation to which the photosensitive layer is sensitive and which is effectively blocked by the unimaged regions of the masking layer, but is at least partly transmitted by the imaged regions of the masking layer, using light sources and procedures known in the art. This radiation is typically in the range of 250 nm to 500 nm. Light sources include, for example, carbon arcs, mercury-vapor arcs, fluorescent lamps, electron flash units, electron beam units and photographic flood lamps. The most suitable sources of ultraviolet radiation are the mercury-vapor lamps, particularly the sun lamps. A standard radiation source is the SYLVANIA® 350 Blacklight fluorescent lamp (FR 48T12/350 VL/VHO/180, 115 w), which has a central wavelength of emission around 354 nm.

Overall exposure forms a latent image in the photosensitive layer. The latent image is made up of polymerized regions, which correspond to the imaged regions of the masking layer, and unpolymerized regions, which correspond to the unexposed regions of the masking layer.

The exposure level depends on the thickness of the photosensitive layer, its sensitivity to the radiation used for overall exposure, and the amount of radiation transmitted by the imaged regions of the masking layer. However, the level of exposure is usually at least 0.1 mJ/cm$^2$.

The process typically comprises a back exposure or backflash exposure step. Backflash exposure is a blanket exposure through the support, using radiation to which the photosensitive layer is sensitive. Backflash exposure creates a shallow layer of photopolymerized material, or a floor, on the support side of the photosensitive layer. The floor improves adhesion between the photosensitive layer and the support and also establishes the depth of the relief image in the resulting flexographic printing plate.

Backflash exposure may be carried out before, after or during the other imaging steps. Preferably, it is carried out after imaging of the masking layer and just prior to overall exposure. Any of the conventional radiation sources discussed above can be used for the backflash exposure step. Exposure time generally range from a few seconds up to about a minute.

Following overall exposure through the mask, the element is developed by washing with a suitable developer. A separate pre-development step to remove the masking layer, such as may be required when an ablatable masking layer is used, is not required. Development is usually carried out at about room temperature. Development converts the latent image to an image by removing the unpolymerized regions of the photosensitive layer.

The developers can be organic solvents, aqueous or semi-aqueous solutions, and water. The choice of the developer will depend primarily on the chemical nature of the photopolymerizable layer. Suitable organic solvent developers include aromatic or aliphatic hydrocarbon and aliphatic or aromatic halohydrocarbon solvents, or mixtures of such solvents with suitable alcohols. Other organic solvent developers have been disclosed in Schober, U.S. Pat. No. 5,354,645. Suitable semi-aqueous developers usually contain water and a water miscible organic solvent and an alkaline material. Suitable aqueous developers usually contain water and an alkaline material. Other suitable aqueous developer combinations are described in Briney, U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the photosensitive layer. However, washout is frequently carried out in an automatic processing unit which uses developer and mechanical brushing action to remove the unexposed portions of the photosensitive layer, leaving a relief constituting the exposed image and the floor formed by the backside flask exposure.

Following development, the resulting flexographic printing plates are typically blotted or wiped dry, and then dried in a forced air or infrared oven. Drying times and temperatures may vary, however, typically the plate is dried for 60 to 120 minutes at 60° C. High temperatures are not recommended because the support can shrink and this can cause registration problems.

Flexographic printing plates are typically overall post-exposed to ensure that the photopolymerization process is complete and that the plate will remain stable during printing and storage. This post-exposure may be carried out with the same radiation source as overall exposure.

Detackification is an optional post-development treatment, which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. No. 4,400,459; Fickes, U.S. Pat. No. 4,400,460; and Herrmann, U.S. Pat. No. 4,906,551. Detackification can also be accomplished by exposure to radiation sources having a wavelength not longer than 300 nm, as disclosed in Gibson U.S. Pat. No. 4,806,506.

INDUSTRIAL APPLICABILITY

The imageable element can be used in the preparation of flexographic printing plates. Imaging produces an integral mask and, thus, the disadvantages of separate or laminated masks, such as dirt entrapment and reduced resolution, are avoided. Because a heated body is used for imaging, expensive infrared absorber is not required and no debris is produced in the imaging process.

The advantageous properties of this invention can be observed by reference to the following examples, which illustrate but do not limit the invention.

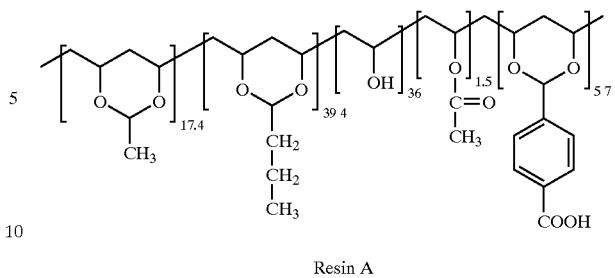

Resin A

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

| Glossary | |
|---|---|
| Aerosol OT | Surfactant, sodium salt of bis(2-ethylhexyl)-sulfosuccinic acid (BASF, Mt. Olive, NJ, USA) |
| Blue Pigment | Dispersion of 6.9% Nega 107 and 6.9% Irgalith Blau GLG (copper phthalocyanine) in 1-methoxypropan-2-ol (86.2%) (Eckart Zulich, Germany) |
| BYK 307 | Polyethoxylated dimethylpolysiloxane copolymer (Byk-Chemie, Wallingford, CT, USA) |
| Ethyl Violet | C.I. 42600; CAS 2390-59-2 ($\lambda_{max}$ = 596 nm) [(p-(CH$_3$CH$_2$)$_2$NC$_6$H$_4$)$_3$C$^+$ Cl$^-$] |
| Malachite Green | Triarylmethane dye |
| MOWIOL ® 4-98 | Poly(vinyl alcohol), 2% acetate (Clariant, Charlotte, NC, USA) |
| Nega 107 | Negative diazo resin derived from condensation of 3-methoxy-diphenylamine-4-diazonium sulfate and 4,4'-bis-methoxymethyldiphenylether, isolated as mesitylene sulfonate salt (Panchim, Lisses, France) |
| PADA | 4-(Phenylazo)diphenylamine (Panchim) |
| PD-140A | Novolac resin (Borden Chemical, Columbus, OH, USA) |
| RP-2 | A 214-novolac resin ester (PCAS, Longjumeau, France) |
| Saran F-310 | Vinylidene chloride/acrylonitrile copolymer (Dow, Midland, MI, USA) |
| Sudan Black B | Azo dye with two azo groups; C.I. 26150 |
| Triazine | 2-(4-Methylthiophenyl)-4,6-bis(trichloromethyl-1,3,5-triazine |
| ZONYL ® FSN | Fluorosurfactant (DuPont, Wilmington, Delaware, USA) |

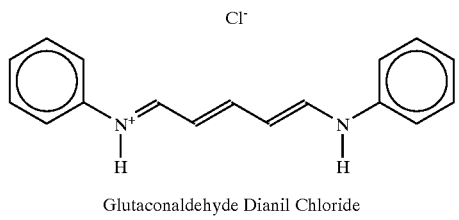

Glutaconaldehyde Dianil Chloride

Example 1

This example describes the preparation and imaging of an imageable element comprising a thermally bleachable masking layer. For illustration, a positive working photosensitive composition is used in the photosensitive layer.

Photosensitive layer Solutions containing 40 wt % RP-2 in 1-methoxypropan-2-ol, 40 wt % PD-140A in 1-methoxypropan-2-ol, 8.86 wt % ethyl violet in 1-methoxypropan-2-ol, and 3 wt % triazine in n-butyl acetate were mixed to form a composition that comprised 25 wt % RP-2, 75 wt % PD-140A, 0.75 wt % triazine, and 1.5 wt % ethyl violet, based on the total amount of RP-2, and PD-140A in the composition. The composition was coated onto a polyethylene terephthalate film substrate with a wire wound bar and the resulting element dried for 80 sec at 130° C. in a Mathis Labdryer oven (Werner Mathis, AG, Switzerland). The coating weight of the photosensitive layer was 1.7 g/m$^2$.

Barrier Layer A coating solution containing 2.465 wt % MOWIOL® 4-98, 0.065 wt % ZONYL® FSN, and 0.026 wt % Aerosol OT in water was coated over the photosensitive layer using a Meyer wire wound bar. The resulting element, consisting of the support, the photosensitive layer, and the barrier layer, was dried in a Labdryer oven at 100° C. for 120 sec. Coating weight of the barrier layer was 1.1 g/m$^2$.

Masking Layer A coating solution comprising 3.5 wt % hydroxypropyl-cellulose, 0.89 wt % gluconaldehyde dianil chloride, and 0.011 wt % BYK-307 in methanol/1-methoxypropan-2-ol (1:1; v:v) was coated over the barrier layer using a wire wound bar. The resulting element, consisting of the support, the photosensitive layer, the barrier layer, and masking layer was dried in a Labdryer oven at 60° C. for 50 sec. Coating weight of the masking layer was 1.2 g/m$^2$.

Imaging and Processing The resulting imageable element was imaged using a Oyo GS618-400 thermal plotter (Oyo Instruments, Houston, Tex., USA) at the following conditions: 400×800 dpi; 50% of the maximum internal power, and transport speed of 0.4 in/sec (about 1.0 cm/sec). The imaged regions of the masking layer became colorless while the unexposed regions remained orange.

The imaged element was flood exposed for 15 sec in an OLIX A1 131 light frame (OLEC, Irvine, Calif., USA). Then it was processed in a Mercury Mark V processor (immersion type processor, Kodak Polychrome Graphics, Norwalk, Conn., USA) containing Goldstar developer (sodium metasilicate developer, Kodak Polychrome Graphics, Norwalk, Conn., USA) (processing speed: 750 mm/min; developer temperature: 22.5° C.). The regions exposed to ultraviolet radiation were removed by the developer, and the regions protected by the mask resisted development. An accurate high resolution of the digital image was transferred to the imaged and processed element.

Example 2

This example describes the preparation and imaging of an imageable element comprising a thermally bleachable masking layer. For illustration, a negative working photosensitive composition is used in the photosensitive layer.

Photosensitive Layer A coating solutions containing 43.48 wt % resin A; 40.14 wt % Nega 107; 0.67 wt % PADA; and 15.71 wt % blue pigment in methanol/methyl ethyl ketone/1-methoxypropan-2-ol/ethyl acetate (42:28:19:11; by weight) was coated onto a polyethylene terephthalate film substrate with a wire wound bar and the resulting element dried for 90 sec at 100° C. in a Mathis Labdryer oven. The coating weight of the photosensitive layer was 1.0 g/m$^2$.

Barrier Layer The barrier layer of Example 1 was coated over the photosensitive layer, and the resulting element dried as in Example 1. The resulting element consisted of the support, the photosensitive layer, and the barrier layer.

Masking Layer The masking layer of Example 1 was coated over the barrier layer, and the resulting element, consisting of the support, the photosensitive layer, the barrier layer, and masking layer was dried as in Example 1.

Imaging and Processing The imageable element was imaged as in Example 1. The imaged regions of the masking layer became colorless while the unexposed regions remained orange. Then the imaged element was flood exposed for 25 sec in the OLIX A1 131 light frame.

The element was processed in a 85N processor (spray on type processor, Glunz and Jensen, Elkwood, Va., USA) containing 956 developer (solvent based developer containing phenoxyethanol, Kodak Polychrome Graphics, Norwalk, Conn., USA) (processing speed: about 700 mm/min). The regions protected by the mask were removed by the developer, and the regions exposed to ultraviolet radiation resisted development. An accurate high resolution of the digital image was transferred to the imaged and processed element.

Example 3

This example illustrates preparation and imaging of an imageable element that comprises a photopolymerizable photosensitive layer.

The coversheet and release layer are removed from a CYREL® 67HLS flexographic printing plate precursor (DuPont, Wilmington, Del., USA). The resulting element comprises a photopolymerizable photosensitive layer on a support. The barrier layer of Example 1 is applied over the photopolymerizable photosensitive layer using a wire wound Meyer bar. The resulting element is heated at 100° C. for 120 sec. Coating weight—1.1 g/m$^2$. The masking layer of Example 1 is applied over the barrier layer using a wire wound Meyer bar. The resulting element is heated at 60° C. for 50 sec. Coating weight—1.2 g/m$^2$.

The resulting imageable element is imaged with the Oyo thermal plotter using the following conditions: at the following conditions: 400×800 dpi; 50% of the maximum internal power, and transport speed of 0.4 in/sec (about 1.0 cm/sec). The imaged regions of the masking layer become colorless while the unexposed regions remain orange.

The imageable element is then given a backflash exposure of 14 sec with a CYREL® 3040 light source (DuPont, Wilmington, Del., USA), and is then given an overall exposure of 2 min through the imaged masking layer without a vacuum. The exposed element is developed in a CYREL® rotary processor (DuPont, Wilmington, Del. USA) for 6 min using a 3:1 mixture (v/v) of tetrachloroethylene (perclene) and butanol. The regions of the photosensitive layer under the unexposed regions of the masking layer are removed, to form a flexographic printing plate. The printing plate is oven dried for one hour at 60° C. and is then simultaneously post exposed and finished in a CYREL®) light finishing unit (DuPont, Wilmington, Del., USA) for 5 min. On printing with the plate, good images are obtained.

Example 4

The Lumirror X43 protective cover film is peeled off a NYLOFLEX® FAR284 (BASF, Mount Olive, N.J., USA) flexographic printing plate, the latter material being composed of polyethylene terephthalate base, a photopolymerizable photosensitive layer, a polyamide barrier layer and the Lumirror foil. The polyamide barrier layer is then also removed from the photosensitive layer using a conventional adhesive tape. The barrier and masking layers from Example 1 are applied onto the photosensitive layer sequentially, using a wire wound Meyer bar, such that the film weights are 1.1 and 1.2 g/m$^2$ respectively. The coatings are dried at 100° C. for 120 sec for the barrier layer and 60° C. for 50 sec for the masking layer.

The printing plate precursor is imaged in a printer equipped with a thin film thermal head with a resolution of 300 dpi that operates with a line time of 32 ms (the time line is the time needed for printing 1 line). During this line time, the print head receives constant power.

After imaging, the element is flood exposed through the mask with ultraviolet radiation (4000 micronW/cm$^2$) for 15 min and is then developed in a drum brush washer using the developer NYLOSOLV® II (BASF, Mount Olive, N.J., USA). After development, the element is dried for 2 hours at 60° C. and is irradiated with UVC (about 220 nm to 280 nm) to detakify, and post exposed with UVC radiation for 10 min. On printing with the element, good images are obtained.

Examples 5–9

Five elements, each consisting of a support, photosensitive layer, and barrier layer, were prepared as described in Example 1. A coating solution, containing the ingredients indicated in Table 1 in acetone/2-methoxyethanol 50:50; v:v), was coated over the barrier layer using a wire wound bar. The resulting element, consisting of the support, the photosensitive layer, the barrier layer, and masking layer was dried in a Mathis Labdryer oven at 105° C. for 180 sec. Coating weight of the masking layer was 3.0 g/m$^2$.

TABLE 1

| | Example Number | | | | |
|---|---|---|---|---|---|
| Component[a] | 5 | 6 | 7 | 8 | 9 |
| Sudan black B | 0.8 | 3.7 | 7.1 | 10.1 | 15.9 |
| p-Toluene sulfonic acid | 3.7 | 3.6 | 3.5 | 3.4 | 3.2 |
| Benzopinacol | 11.2 | 10.9 | 10.5 | 10.2 | 9.5 |
| Saran 310 | 84.3 | 81.8 | 78.9 | 76.3 | 71.4 |

[a]wt %

The resulting imageable elements were imaged as described in Example 1, except that the transport rate was 0.1 in/sec (about 0.25 cm/sec). The imaged regions of the masking layer became colorless while the unexposed regions remained blue/black for Examples 5 and 6 and remained black for Examples 7–9.

The imaged element was flood exposed and processed as described in Example 1. The developer processing speed was 750 mm/min for Examples 7–9, 1000 mm/min for Example 6, and 1750 mm/min for Example 5. The developer temperature was 22.5° C.

For Examples 6–9, the regions exposed to ultraviolet radiation were removed by the developer, and the regions protected by the mask resisted development. An accurate high resolution of the digital image was transferred to the imaged and processed elements. For Example 5, both the ultraviolet exposed regions and the regions protected by the mask were removed by the developer.

Examples 10–13

Four elements, each consisting of a support, photosensitive layer, and barrier layer, were prepared as described in Example 1. A coating solution, containing the ingredients indicated in Table 2 in acetone/2-methoxyethanol/-methyl ethyl ketone (36:36:28; v:v:v), was coated over the barrier layer using a wire wound bar. The resulting element, consisting of the support, the photosensitive layer, the barrier layer, and masking layer was dried in a Labdryer oven at 60° C. for 50 sec. Coating weight of the masking layer was 6.0 g/m$^2$.

TABLE 2

| Component[a] | Example Number | | | |
|---|---|---|---|---|
| | 10 | 11 | 12 | 13 |
| Malachite Green | 0.4 | 1.1 | 0.5 | 0.8 |
| Benzopinacol | 11.1 | 11.0 | 5.9 | 19.8 |
| Saran 310 | 88.5 | 87.9 | 93.6 | 79.4 |

[a]wt %

The resulting imageable elements were imaged as described in Example 1, except that the transport rate for Examples 10, 11, and 12 was 0.1 in/sec (about 0.25 cm/sec) and for Example 13 was 0.4 in/sec (about 1 cm/sec). The imaged regions of the masking layer became colorless while the unexposed regions remained green.

The imaged element was flood exposed and processed as described in Example 1, except that Examples 10, 12, and 13 were flood exposed for 10 sec and Example 11 was flood exposed for 20 sec. The developer processing speed was 1550 mm/min and the developer temperature was 22.5° C. The regions exposed to ultraviolet radiation were removed by the developer, and the regions protected by the mask resisted development. An accurate high resolution of the digital image was transferred to the imaged and processed elements.

Having described the invention, we now claim the following and their equivalents.

What is claimed is:

1. An imageable element comprising, in order:
   (a) a flexible substrate,
   (b) a photosensitive layer, the photosensitive layer comprising a negative working photosensitive composition, and
   (c) a masking layer, the masking layer comprising a binder and a thermally bleachable system;
   in which:
   the thermally bleachable system comprises a dye that has an absorption maximum between about 250 nm and about 600 nm, and
   the masking layer is substantially free of photothermal conversion materials.

2. The imageable element of claim 1 in which the photosensitive layer comprises a photopolymerizable composition.

3. The imageable element of claim 2 in which the masking layer comprises a thermally bleachable dye.

4. The imageable element of claim 3 in which the thermally bleachable dye is selected from the group consisting of N-alkoxycarbocyanine dyes and gluconaldehyde dianil chloride.

5. The imageable element of claim 2 in which the masking layer comprises a dye and a component that undergoes a thermally initiated reaction to form intermediates that react with the dye to reduce its absorption in the range of about 250 nm and about 600 nm.

6. The imageable element of claim 5 in which the dye is a reducible dye and the component that undergoes a thermally initiated reaction is a benzopinacol.

7. The imageable element of claim 6 in which the reducible dye is an azo dye.

8. The imageable element of claim 1 in which the imageable element additionally comprises a barrier layer between the photosensitive layer and the masking layer.

9. The imageable element of claim 1 in which the photosensitive layer is at least 0.25 cm thick.

10. The imageable element of claim 9 in which the imageable element additionally comprises a barrier layer between the photosensitive layer and the masking layer.

11. The imageable element of claim 10 in which the photosensitive layer comprises a photopolymerizable composition.

12. The thermally bleachable element of claim 11 in which the dye has an absorption maximum between about 300 nm and about 500 nm.

13. A method for forming an image, the method comprising the steps of:
   (A) providing an imageable element, the imageable element comprising, in order:
      (i) a flexible substrate,
      (ii) a photosensitive layer, the photosensitive layer comprising a negative working photosensitive composition, and
      (iii) a masking layer, the masking layer comprising a binder and a thermally bleachable system;
      in which:
      the thermally bleachable system comprises a dye that has an absorption maximum between about 250 nm and about 600 nm, and
      the masking layer is substantially free of photothermal conversion materials;
   (B) imaging the masking layer with a heated body and forming a mask;
   (C) overall exposing the imageable element through the mask and forming an imaged imageable element comprising imaged and complementary unimaged regions in the photosensitive layer; and
   (D) developing the imaged imageable element in a developer and forming the image by removing the unimaged regions.

14. The method of claim 13 in which the photosensitive layer is at least 0.25 cm thick; the imageable element additionally comprises a barrier layer between the photosensitive layer and the masking layer; and the photosensitive layer comprises a photopolymerizable composition.

15. The method of claim 14 in which the masking layer comprises a thermally bleachable dye.

16. The method of claim 15 in which the thermally bleachable dye is selected from the group consisting of N-alkoxycarbocyanine dyes and gluconaldehyde dianil chloride.

17. The method of claim 14 in which the masking layer comprises a dye and a component that undergoes a thermally initiated reaction to form intermediates that react with the dye to reduce its absorption in the range of about 250 nm and about 600 nm.

18. The method of claim 17 in which the dye is a reducible dye and the component that undergoes a thermally initiated reaction is a benzopinacol.

19. The method of claim 18 in which the reducible dye is an azo dye.

20. The method of claim 14 additionally comprising a backflash exposure between step (A) and step (D).

21. The method of claim 20 in which the backflash exposure is between step (B) and step (C).

22. The method of claim 20 in which the dye has an absorption maximum between about 300 nm and about 500 nm.

* * * * *